United States Patent [19]
Burnworth et al.

[11] Patent Number: 5,788,511
[45] Date of Patent: Aug. 4, 1998

[54] UNIVERSAL CONNECTOR PAD

[75] Inventors: Randy J. Burnworth, San Diego, Calif.; Kenneth C. Tate, Bellingham, Wash.

[73] Assignee: RAVE Engineering, San Diego, Calif.

[21] Appl. No.: 613,289

[22] Filed: Mar. 11, 1996

[51] Int. Cl.$^6$ .................................................. H01R 9/09
[52] U.S. Cl. ............................ 439/63; 174/261; 439/55
[58] Field of Search ............................ 439/63, 68, 70, 439/55; 174/261

[56] References Cited

U.S. PATENT DOCUMENTS

| | | | |
|---|---|---|---|
| 4,231,629 | 11/1980 | Kirby | 439/17 |
| 4,645,288 | 2/1987 | Stursa | 439/177 |
| 4,861,271 | 8/1989 | Bogar et al. | 439/63 |
| 4,941,831 | 7/1990 | Tengler et al. | 439/63 |
| 4,964,805 | 10/1990 | Gabany | 439/63 |
| 5,064,378 | 11/1991 | Olson et al. | 439/55 |
| 5,120,258 | 6/1992 | Carlton | 439/581 |
| 5,169,343 | 12/1992 | Andrews | 439/608 |
| 5,383,095 | 1/1995 | Korsunsky et al. | 439/53 |
| 5,397,241 | 3/1995 | Cox et al. | 439/79 |
| 5,411,409 | 5/1995 | Gray et al. | 439/329 |

*Primary Examiner*—Gary F. Paumen
*Assistant Examiner*—T. C. Patel
*Attorney, Agent, or Firm*—Robert D. Varitz

[57] ABSTRACT

A universal connector pad is intended for use on a printed circuit board and is used to connect a variety of connector types to the printed circuit board, without having to provide a specific connector pad layout which is unique to a specific connector type. The connector pad includes multiple rows and columns of solder pads, which receive a variety of connectors, wherein at least some of the solder pads are usable by more than one type of connector.

4 Claims, 1 Drawing Sheet

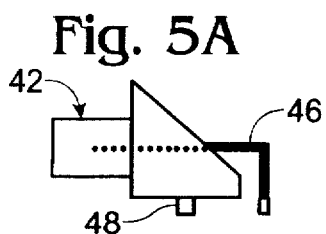
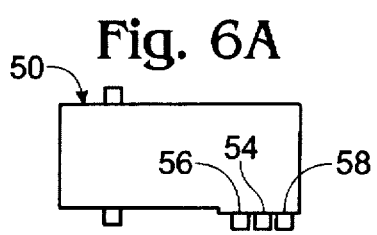
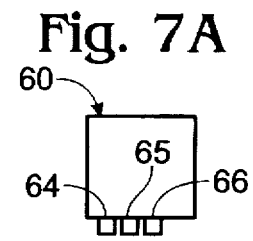
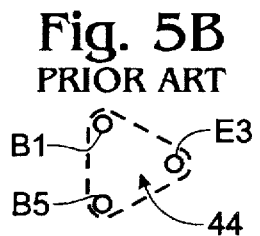
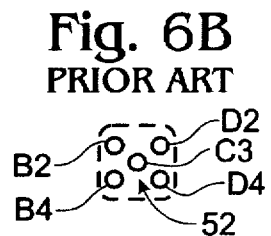
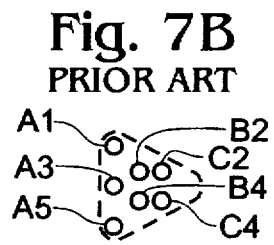
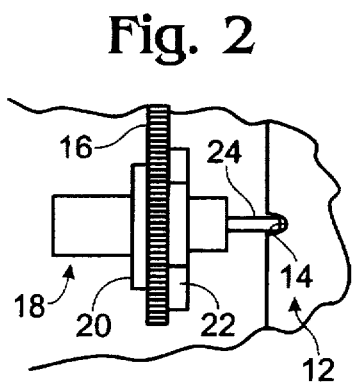
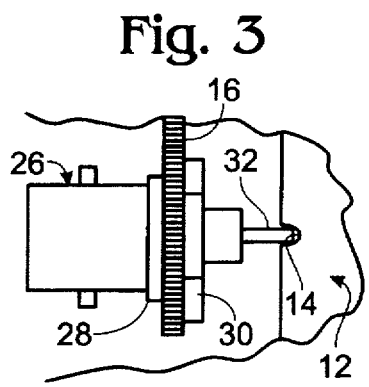
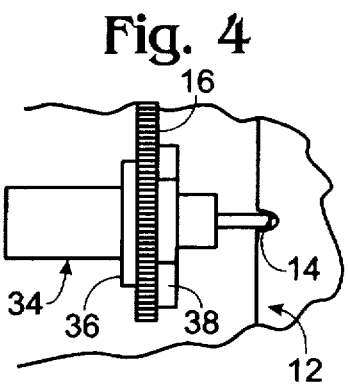
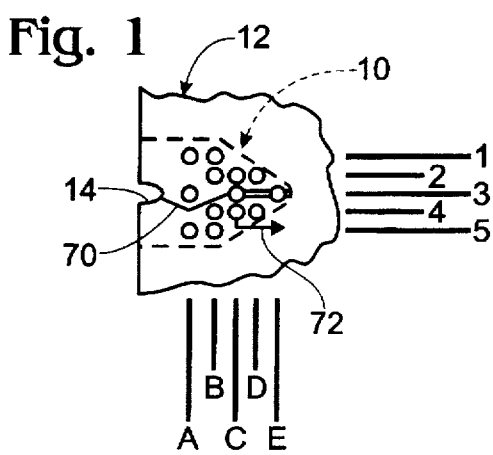

UNIVERSAL CONNECTOR PAD

FIELD OF THE INVENTION

This invention relates to the construction of printed circuit boards, and specifically to the construction of a printed circuit board that has a universal connector pad thereon, which pad accommodates the mounting of a variety of connector types.

BACKGROUND OF THE INVENTION

In the manufacture printed circuit boards, the board must be laid out to accommodate a variety of components which are placed upon the board during assembly. A board may be manufactured to perform a specific function and to accommodate a particular type of connector, which, for instance, allows the connection of a cable having a mating connector thereon to the board. In many instances, different types of connectors may provide the same or similar functions, however, in normal printed circuit board fabrication, a specific connection pad layout must be formed on the board to accommodate a specific type of connector. For instance, an RCA connector requires a different type of connection pad than does a BNC connector. Additionally, a ninety degree BNC connector requires a different type of pad than a BNC panel connector.

There exists a large number of techniques for attaching cables to printed circuit boards. Kirby, U.S. Pat. No. 4,231,629, describes an apparatus for connecting multiple coaxial cables to a printed circuit board by means of a metal framework which is secured to the board.

Stursa, U.S. Pat. No. 4,645,288, discloses a coaxial connector which may be installed on a printed circuit board.

Bogar et. al., U.S. Pat. No. 4,861,271,discloses an apparatus for providing a multiplicity of right-angle coaxial connectors.

Tengler et. al., U.S. Pat. No. 4,941,831, discloses an apparatus for connecting a number of coaxial cables to a board in order to maintain high frequency RF shielding.

Gabany, U.S. Pat. No. 4,964,805, discloses a micro coaxial connector having an outer, RF shielding shell.

Carlton, U.S. Pat. No. 5,120,258, discloses an apparatus for providing connection of a low inductance shielded cable to a printed circuit board.

Andrews, U.S. Pat. No. 5,169,343, discloses a coaxial cable connector module which allows multiple connections to be made in a single module set.

Gray et. al., U.S. Pat. No. 5,411,409, discloses a coaxial cable connector and a mounting arrangement therefor to facilitate fabrication of printed circuit boards.

Cox et. al., U.S. Pat. No. 5,397,241, discloses an electrical connector which enables a large number of connections to be made in a very small space.

None of the aforementioned examples of mounting connectors to printed circuit boards teaches or suggests that more than one kind of connector may be mounted on a given connector pad.

SUMMARY OF THE INVENTION

The universal connector pad of the invention is intended for use on a printed circuit board and is used to connect a variety of connector types to the printed circuit board, without having to provide a specific connector pad layout which is unique to a specific connector type. The connector pad includes multiple rows and columns of solder pads, which receive a variety of connectors, wherein at least some of the solder pads are usable by more than one type of connector.

An object of the invention is to provide a universal connector pad which may facilitate the placement of a variety of different types of connectors on a printed circuit board.

Another object of the invention is to provide a universal connector pad which provides for the connection of like-purpose solder pads to one another.

These and other objects and advantages of the invention will become more fully apparent as the description which follows is read in connection with the drawings.

BRIEF DESCRIPTION OF THE DRAWINGS

FIG. 1 is top plan view of a universal connector pad constructed according to the invention.

FIG. 2 is a side elevation of an F panel connector mounted on the universal connector pad of the invention.

FIG. 3 is a BNC straight panel connector mounted on the universal connector pad of the invention.

FIG. 4 is an RCA phono panel connector mounted on the universal connector pad of the invention.

FIG. 5A is an RCA ninety-degree phono connector and FIG. 5B is a conventional connector pad for the connector of FIG. 5A.

FIG. 6A is an BNC ninety-degree phono connector and FIG. 6B is a conventional connector pad for the connector of FIG. 6A.

FIG. 7A is an S-video (Y/C) ninety-degree phono connector and FIG. 7B is a conventional connector pad for the connector of FIG. 7A.

BEST MODE OF PRACTICING THE INVENTION

Referring now to the figures, and initially to FIG. 1, a universal connector pad constructed according to the invention as depicted generally at 10. Pad 10 is depicted on a printed circuit board 12, of which only a portion is depicted. Connector pad 10 includes a number of solder pads therein, such as solder pad 14, which is a board-edge, open-hole solder pad. Connector pad, as used herein, means an area including an array of solder pads therein. It will be understood to those of ordinary skill in the art that the various solder pads depicted herein connect to runs of printed circuit material, which are located on and in printed circuit board 12. The usual circuit board includes four layers of insulating material, forming a substrate for the board. Runs of conductive material are located on both outer surfaces of the board (layers one and four), as well as in the board substrate. The outer located layers are referred to herein as signal-conducting layers. An embedded layer, referred to herein as layer 2, carries power to components located on the board. Another embedded layer, referred to herein as layer 3, provides ground connections to the components located on the board.

A component, such as a connector, is placed on a printed circuit board 12, with connector pins thereof extending through the bores associated with each solder pad, or into the open-hole associated with solder pad 14. The connectors are then soldered in place, either manually or automatically.

A number of other solder pads are depicted as part of connector pad 10, which solder pads are arranged in multiple rows and columns. As shown in FIG. 1, the solder pads are arranged in rows 1 through 5 and in columns A through E. Thus, column A contains solder pads A1, A3 and A5. Column E contains a single solder pad, E3. Such solder pads are well known in the art, and generally include a ring of conductive material about a bore, which bore extends through PCB 12, thereby communicating with both sides of the PCB. Each bore also communicates with a run of conductive material in an appropriate layer of the PCB. Board-edge solder pad 14 is part of row 3.

Turning now to FIGS. 2–4, a variety of connectors are depicted as being attached to universal connector pad 10. In the instances shown in FIGS. 2–4, all of the connectors are attached to open-hole solder pad 14, and are secured adjacent PCB 12 by means of a metal frame 16, which may be an external case for PCB 12, or may be a specially provided framework attached to PCB 12. The other solder pads in connector pad 10 are not shown in FIGS. 2–4 for purposes of clarity.

In the case on FIG. 2, an F, or RF, panel connector 18 is depicted secured in metal frame 16, and held in place by means of a flange 20, which may be integrally formed with connector 18, and a lock nut 22. The center, or signal, lead 24 of connector 18 is soldered to pad 14, which is connected to layer one or four, depending on board layout.

Referring now to FIG. 3, a BNC straight panel connector is depicted at 26. As in the case of RCA phono connector 18, connector 26 includes a flange 28, which abuts one side of frame 16, the other side of which is held in place by a lock nut 30. Signal lead 32 is soldered to solder pad 14 which is connected to one of the signal-bearing layers.

FIG. 4 depicts an RCA phono plug panel connector 34 having a flange 36, and mounted on frame 16. Lock nut 38 holds the connector in place. A signal lead 40 is soldered to solder pad 14.

FIG. 5A represents a conventional RCA phono plug ninety-degree connector, shown generally at 42. A conventional connector pad for connector 42 is depicted generally at 44 in FIG. 5B, and includes solder pads B1, B5 and E3, which correspond to solder pads B1, B5 and E3 in universal connector pad 10. In this configuration, solder pad E3 is the signal-bearing pad and is connected to a signal lead 46 of connector 42, while solder pads B1 and B5, which are referred to herein as ground solder pads, are connected to ground layer 3 of PCB 12 and to ground terminals of connector 42, such as terminal(s) 48.

Referring now to FIG. 6A, a BNC ninety-degree connector is depicted generally at 50. A conventional connector pad 52 for connector 50 is depicted in FIG. 6B as being located on PCB 12 and includes solder pads B2, B4, C3, D2 and D4, which correspond to pads B2, B4, C3, D2 and D4 of FIG. 1. Connector signal lead 54 connects to solder pad C3, while the other leads, such as 56 and 58, connect to grounded solder pads in rows B and D, respectively.

Turning now to FIG. 7A, a S-video connector is depicted generally at 60. A conventional connector pad for connector 60 is depicted in FIG. 7B at 62, and includes solder pads A1, A3, A5, B2, B4, C2 and C4, which correspond to solder pads A1, A3 and A5, B2 and B4, and C2 and C4 in FIG. 1. Connector 60 includes a Y (luminance) signal lead and a C (chrome) signal lead, which are connected to solder pads C2 and C4, respectively.

It is thus apparent that a single universal connector pad constructed according to the invention may be formed on a PCB, thereby providing for insertion and connection of a variety of connectors on the pad. Solder pads 14, C2, C3 and E3 may be connected by a single run of conductive material,
as depicted by a first signal conducting run 70 in FIG. 1, which is also referred to herein as a composite signal carrier. Solder Pad C4 is connected to a conductive run, as depicted by second signal conducting run 72 in FIG. 1, to provide the C portion of a signal to an S-Video connector. The remaining solder pads are connected to ground layer 3, and provide a ground connection for the connectors mounted on the universal connector pad.

Although the universal connector pad of the invention may be used on any type of PCB, it is particularly useful for use on an expansion board, as is described in my co-pending application for COMPUTER EXTENSION BOARD, Ser. No. 08/613,595 filed Mar. 12, 1996, and which is incorporated herein by reference. A feature of the invention described in that application is referred to as an impedance matching circuit. Such a circuit may be provided to insure that the connectors carried on the universal mounting pad of the invention have the proper impedance. Alternately, a trim impedance driver may be provided with the universal connector pad of the invention. In the case of an F connector, the nominal impedance is 50 ohms. A BNC connector generally has a 75 ohm impedance. RCA phono plugs and S-Video connectors do not have specified impedances. The normal procedure is to adjust the trim impedance driver to 75 ohms, which is generally sufficient to accommodate the 50 ohm impedance required by a F connector.

Although an embodiment of the universal connector pad of the invention has been described herein as used with specific types of connectors, it should be appreciated that other connectors may be used with such a pad, provided that they have pins which are appropriately spaced. It should be appreciated that variations and modifications may be made to the invention as disclosed herein and defined in the appended claims.

I claim:

1. A combination of a circuit board and universal connector pad thereon, wherein the circuit board includes an insulating substrate, a ground conductive layer, a signal conductive layer and an electrical circuit having separate conductive runs therein; wherein the universal connector pad is adapted to receive any one of a plurality of different varieties of connectors having different mounting contact configurations, wherein the variety of connectors consists of RCA phono connectors, RCA phono panel connectors, BNC connectors, BNC phono panel connectors, RF panel connectors and S-video connectors, the universal connector pad comprising:

a first plurality of solder pads mounted on the substrate and defining a first connector pad for receiving a first one of the variety of connectors; and a second plurality of solder pads also mounted on the substrate and defining a second connector pad for receiving a second one of the variety of connectors, said second connector pad completely overlapping said first connector pad, said second plurality of solder pads being different from said first plurality of solder pads; and wherein each of said solder pads is connected to the electrical circuit.

2. The combination of a circuit board and universal connector pad of claim 1.

3. The combination of a circuit board and universal connector pad of claim 1.

4. The combination of a circuit board and universal connector pad of claim 3 wherein said solder pads are arranged in rows and columns having the following arrangement:

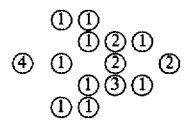

wherein ① represents a solder pad having a bore extending through the PCB and connected to a grounded layer, ② and ③ represent solder pads each having a bore extending through the PCB, ②, and ③ and ④ solder pads connected to the signal-conducting layer thereof, wherein ② and ④ solder pads are connected to a first signal conducting run, wherein ④ represents a board-edge, open-hole pad, and wherein ③ solder pad is connected to a second signal conducting run.

* * * * *